(12) United States Patent
Chang

(10) Patent No.: US 7,315,001 B2
(45) Date of Patent: Jan. 1, 2008

(54) CABLE FIXING STRUCTURE

(75) Inventor: Lin-Wei Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/396,072

(22) Filed: Mar. 30, 2006

(65) Prior Publication Data
US 2007/0227770 A1 Oct. 4, 2007

(51) Int. Cl.
*H02G 3/08* (2006.01)
(52) U.S. Cl. ............. 174/481; 174/117 F; 174/117 FF; 174/500; 439/207; 439/470
(58) Field of Classification Search ........ 174/480–500, 174/117 F, 117 FF, 70 C, 21 R, 68.1, 68.3; 439/207, 442, 449, 535, 459, 470, 493; 52/220.7; 248/205.1; 220/3.4, 3.5, 3.6, 3.9
See application file for complete search history.

(56) References Cited

U.S. PATENT DOCUMENTS 5,380,951 A * 1/1995 Comerci et al. ............ 174/503
5,639,259 A * 6/1997 Wellinsky ................... 439/470

* cited by examiner

*Primary Examiner*—Dhiru R. Patel
(74) *Attorney, Agent, or Firm*—Peter F. Corless; Steven M. Jensen; Edwards Angell Palmer & Dodge LLP

(57) ABSTRACT

A cable fixing structure mounted in a case of an electronic device allowing a cable to cross over a circuit board erectly mounted therein, then pass to another end of the electronic device, includes a carrier, having a ledge part mounted thereon, and a press part, coupled with the ledge part thereon, which fixes the cable on the ledge part of the carrier for positioning the cable, therefore solving the problem in prior art where drilling a hole on a circuit board is necessary for the cable to pass through the narrow space of a server.

4 Claims, 5 Drawing Sheets

CABLE FIXING STRUCTURE

FIELD OF INVENTION

The present invention is related to cable fixing structures; and more particular, to a cable fixing structure used in a computer server.

BACKGROUND OF THE INVENTION

Along with the unceasing progress and development of technology, electronic devices have already become an indispensable part of the modern life. In general, an electronic device, (e.g. a server) has several major accessories such as CD/DVD-Rom, power supply, circuit board and so on, which are all mounted within the case of the electronic device. As well as electronic accessories, there are other electronic components such as memory card, CPU, fan and so on. As functions of computer advance constantly, the accessories and electronic components accommodated in the electronic device grow in number, which occupy the majority of space in the electronic device. On the premises of not reducing accessories and electronic components, how to fully use the limited space is the current problem to be solved.

For instance, in the prior art, referred to the FIG. 1, is a schematic cross-sectional view of a conventional cable-fixing device 6 mounted within a case of an electronic device 4. As shown in the drawing, the fixing structure 6 has a case 61, having a block 611 at the end thereof, a circuit board disposing area 62 and a cable disposing area 63 therein. The circuit board disposing area 62 is used to dispose a circuit board 3 thereon, and the cable disposing area 63 is used to dispose cables (not shown in the drawing thereon. The circuit board 3 has a first connecting stand 31 connected with a connecting point of one end of the cable, while the other end of the cable is disposed in the cable disposing area 63. Thereby, the fixing device 6 mounted in the electronic device case 4, passes through a hole 52 of the circuit board therein, as a result, the connecting point of the cable in the cable disposing area 63 passes through the backside of the circuit board, so that it is easy to disassemble and assemble in latter processes.

However, in order for the case 61 of the above-mentioned fixing device 6 to pass through the circuit board mounted in the case 4 of the electronic device, a hole 52 with a sufficient width for accommodating the case 4 must be pre-formed on the circuit board 5. One of the drawbacks of this is that it causes a waste of material of the circuit board 5, and in addition, accommodating more electronic components on the circuit board may not be possible.

Therefore, it is a present issue to be solved urgently of how to reduce material of a circuit board 5 to the minimum, but allow the cable to pass through the back of the backside 51 of the circuit board 5.

SUMMARY OF THE INVENTION

In the view of the prior art drawbacks, a primary objective of the present invention is to provide a cable fixing structure, allowing a cable from one end of a case of an electronic device to cross over the circuit board erectly mounted within the electronic device, to another end of the case of the electronic device, for the ease of assembling in latter processes.

Another objective of the present invention is to provide a cable fixing structure, for solving the problem of a waste of materials, without the need of drilling a hole on the circuit board to allow the cable to pass through the inner space within the case of the electronic device.

Still another objective of the present invention is to provide a cable fixing structure, for allowing the cable to be easily assembled and disassembled in a short time.

A further objective of the present invention is to provide a cable fixing structure, wherein the volume of the case of the cable fixing structure is reduced so as to reduce the cost of production.

A further objective of the present invention is to provide a cable fixing structure, which is simple in structure and easy to manufacture.

In order to achieve the foregoing objectives, the present invention provides a cable fixing structure mounted within an electronic device case, comprising: a carrier, having a ledge part; and a press part coupled on the top of the ledge part, to press the cable down so as to fix the cable on the ledge part of the carrier. The cable fixing structure proposed by the invention is simple in structure and easy to manufacture.

The ledge part has the first mounting hole and the second mounting hole, wherein, the first carrier protrudes the first mounting hole, and the second carrier protrudes the second mounting hole. The material of the press part can be selected from a group comprising: an elastic material, plastic material or metal material, and the one end of the press part is coupled on the ledge part through a coupling means such as screw, screw rivet, wedge, or adhesive.

A circuit board wedged by the fixing structure has a first connecting stand and a second connecting stand and is electrically connected to a plurality of connecting ports of the carrier through connecting wires, allowing communication with external signals.

The first cable of the cable comprises a first connecting point coupled with the first connecting stand. The second cable comprises a third connecting point coupled with the second connecting stand. Correspondingly, extending the other end of the first cable 21 and the second cable 22, there are formed with a second connecting point and a fourth connecting point respectively, which are disposed correspondingly in the first mounting hole and the second mounting hole of the ledge part, whereon it is supported by the first carrier and second carrier respectively. Lastly, one end of a screw-fixed press part fixes the cable on the, ledge part, and another end is fixed with bolt, so as to complete the process of disposing cables therein.

To mount a fixing structure in a case of an electronic device, the ledge part connected with the carrier must crosses over the circuit board having a small groove which is erectly mounted on the top of the case of the electronic device, allowing the second connecting point and the fourth connecting point of the cable of the first mounting hole and the second mounting hole to pass to the back of the backside of the circuit board, for the ease of dissembling and assembling in latter processes. Thereby, it solves the problem of wasting material, resulted from drilling a hole on the circuit board when the cable passes through the narrow space of the case of the electronic device in the prior art.

One end of the press part is screwed on the ledge part, or alternatively another end of the press part can be fixed on the ledge part through a magic adhesive tape, so as to physically couple the press part with the ledge part to easily assemble and disassemble the cable in a short time. Replacement with magic adhesive tape on the two ends of the press part is also advantageous for reducing the production cost.

Due the prior art wherein a relative big hole must be preserved on the circuit board, the circuit board area is reduced, making it impossible to dispose more electronic components thereon.

Therefore, the present invention of a cable fixing structure can solve the problem of drill a relative big hole on the circuit board in the prior art.

DETAILED DESCRIPTION OF THE PREFERRED EMBODIMENTS

Figure 1:
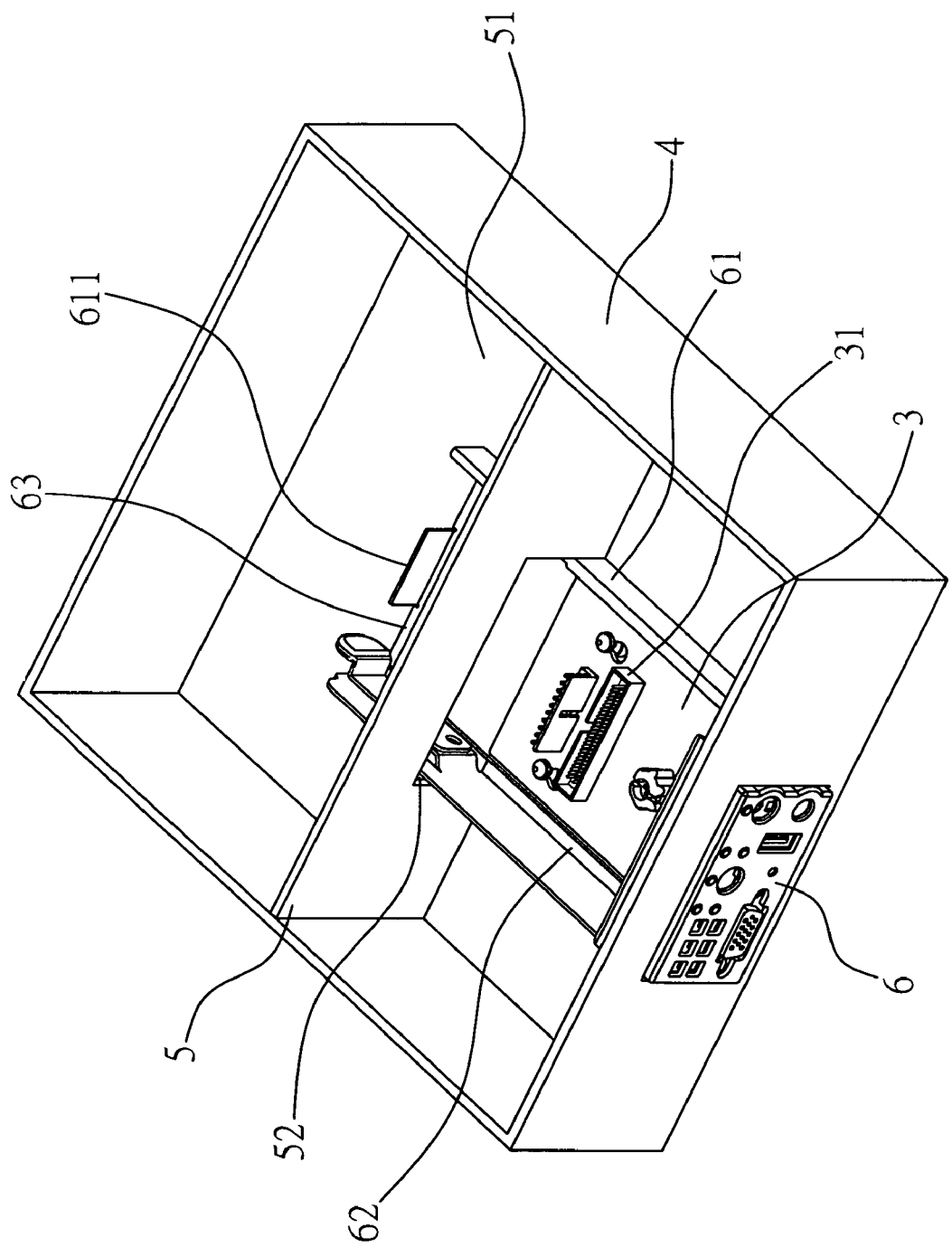
FIG. 1 (PRIOR ART) is a schematic cross-sectional diagram showing a conventional cable fixing structure mounted in a case of an electronic device.

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention. In addition, the drawing and the components shown herein are not to scale and are made in simplicity with provision of only associated components related to the invention; in practical usage, the component should be more complexly structured and the number, size, shape and arrangement of each component can be varied accordingly.

The present invention can be more fully understood by reading the following detailed description of the preferred embodiments, with reference made to the accompanying drawings.

Figure 2:
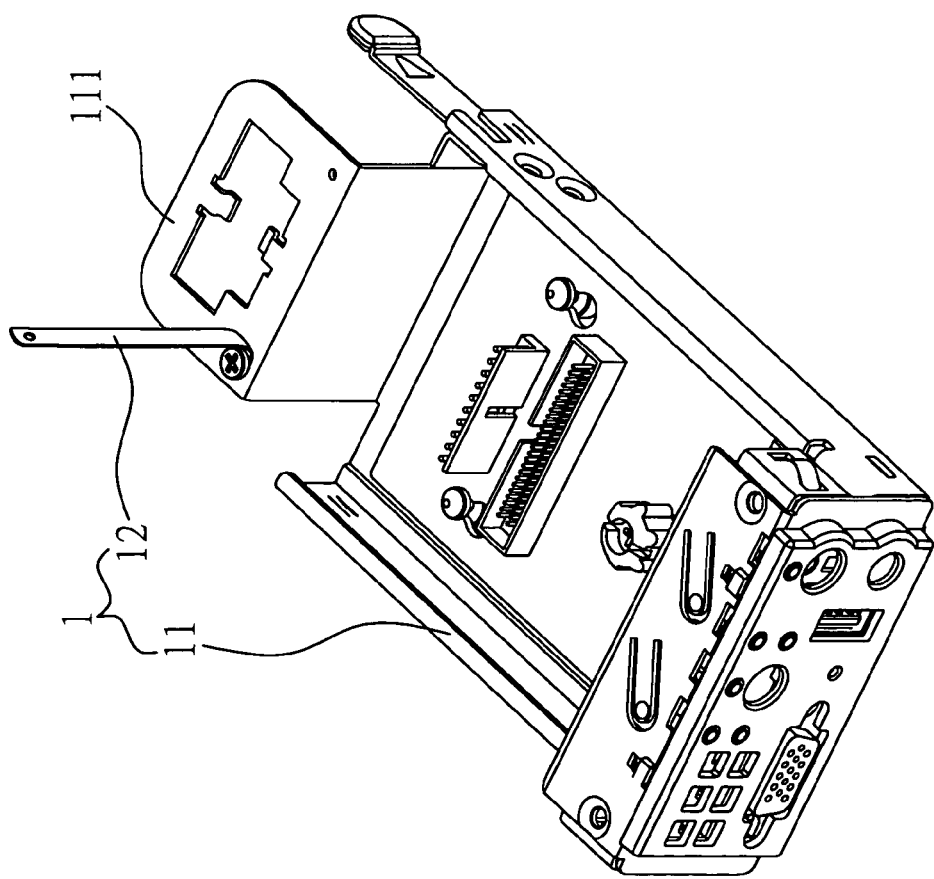
FIG. 2 is a schematic cross-sectional diagram showing a cable fixing structure of the present invention.

Referred to FIG. 2, is a schematic cross-sectional diagram of a cable fixing structure 1 of the present invention. As shown in the drawing, it primarily comprises: a carrier 11, having a ledge part 111 mounted thereon, and a press part 12 coupled on the top of ledge part 111, for pressing the cable (not shown in the drawing) to press the cable down for fixing the cable on the ledge part 111 of the carrier 11. The fixing structure 1 is simple in structure and easy to manufacture.

Figure 3:
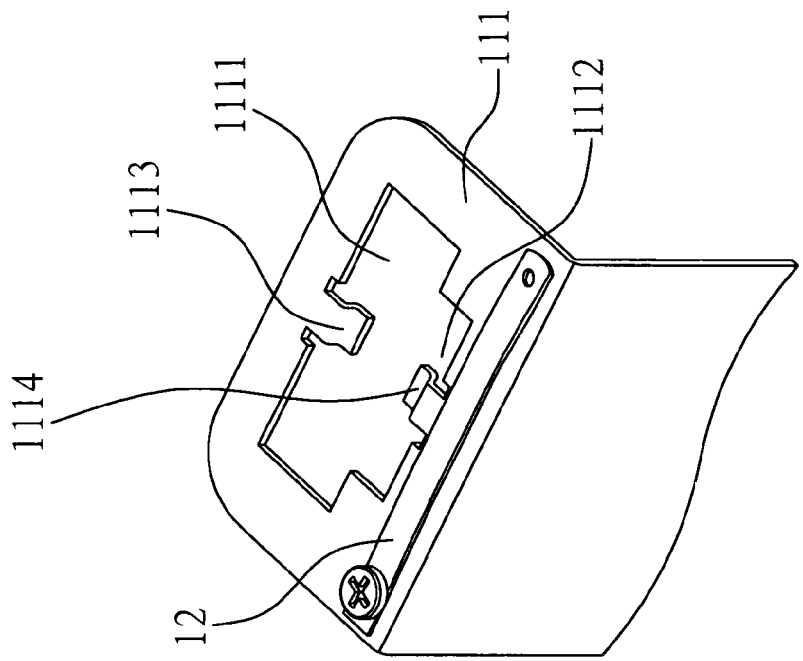
FIG. 3 is a schematic cross-sectional diagram showing a cable fixing structure with a press part fixed on the ledge part of a carrier of the present invention.

Referred to FIG. 3. is a schematic cross-sectional diagram of a cable fixing structure 1 with a press part 12 being fixed on the ledge part 111 of a carrier of the present invention. As shown in the drawing, the ledge part 111 is formed with the first mounting hole 1111 and the second mounting hole 1112, wherein, a first carrier 1113 protrudes the first mounting hole 1111, and the second carrier 1114 protrudes the second mounting hole 1112. The material of the press part 12 can be selected from a group comprising: an elastic material, a plastic material or a metal material. One end of the press part 12 is coupled to one side of the ledge part 111 through a coupling means such as screw, rivet, wedge, or adhesive.

Figure 4:
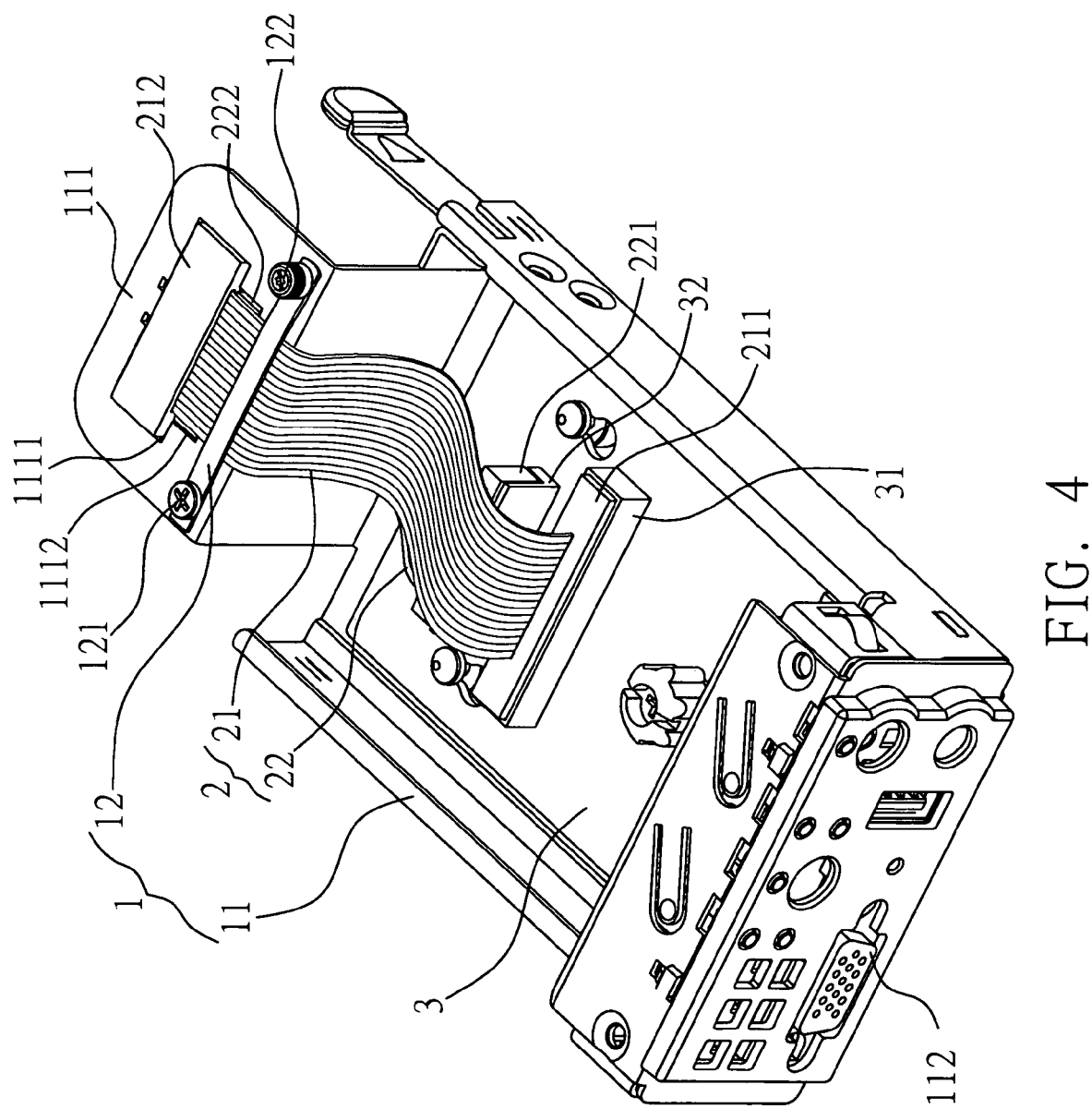
FIG. 4 is a schematic cross-sectional diagram showing a cable being disposed smoothly on the fixing structure in accordance with the first preferred embodiment of the present invention.

Referred to FIG. 4, is a schematic cross-sectional diagram showing a cable being smoothly disposed on the cable fixing structure 1 of the first preferred embodiment of present invention. As shown in the drawing, the circuit board 3 wedged by the fixing structure, has a first connecting stand 31 and a second connecting stand 32 and is electrically connected to a plurality of connecting ports 112 of the carrier 11 through connecting wires, allowing communication with external signals.

The first cable 21 of the cable 2 comprises a first connecting point 221 coupled with the first connecting stand 31. The second cable 22 comprises a third connecting point 221 coupled with the second connecting stand 32. Correspondingly, extending the other end of the first cable 21 and the second cable 22, there are formed with a second connecting point 212 and a forth connecting point 222 respectively, which are disposed correspondingly in the first mounting hole 1111 and the second mounting hole 1112 of the ledge part 111, whereon it is supported by the first carrier 1113 and second carrier 1114. Lastly, one end of a screw-fixed press part 12 fixes the cable 2 on the ledge part 111, and another end is fixed with a bolt 122, so as to complete the process of disposing cables 2 therein.

Figure 5:
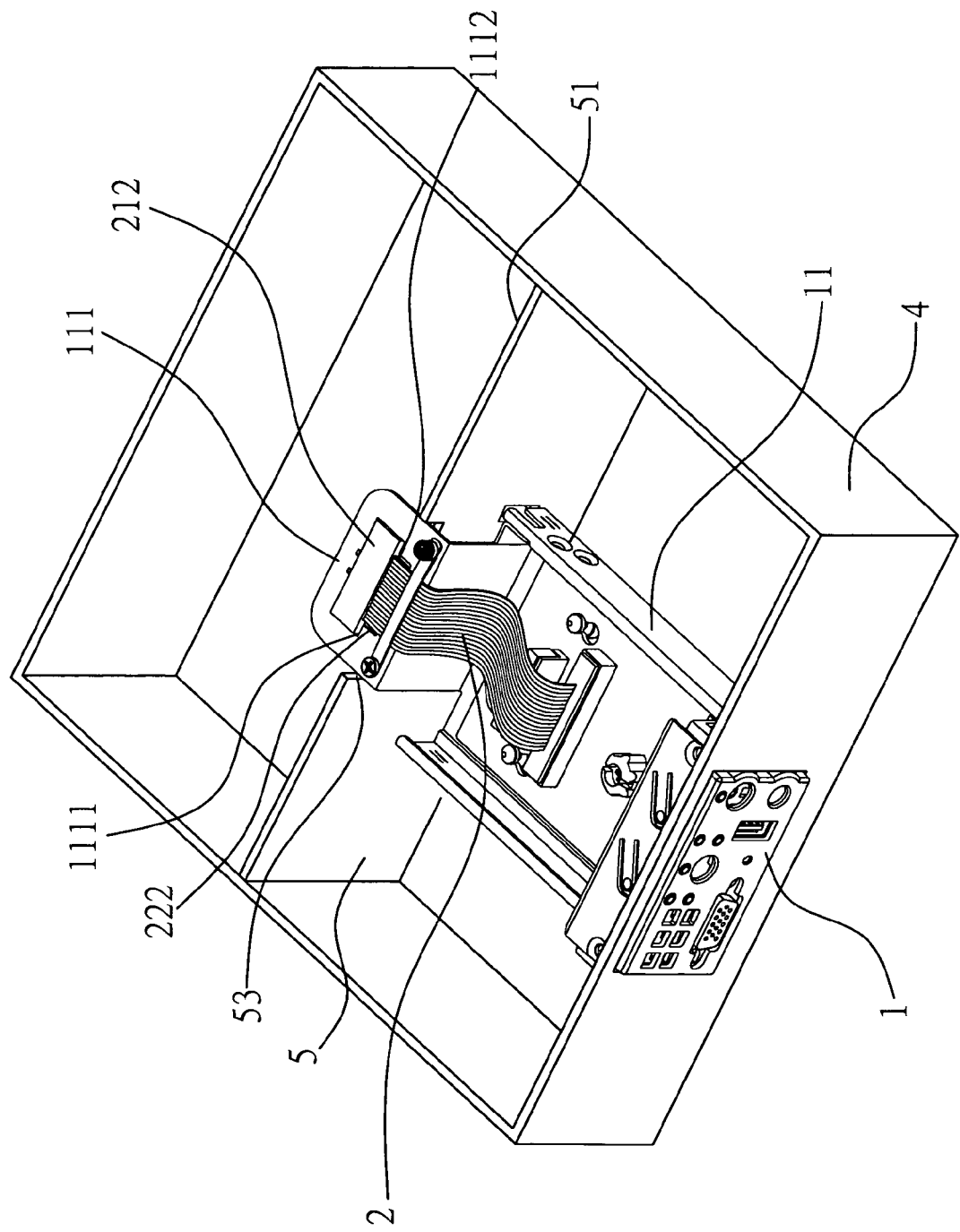
FIG. 5 is a schematic cross-sectional diagram showing a cable fixing structure mounted in a case of an electronic device of the present invention.

Referred to FIG. 5, is a schematic cross-sectional diagram of a cable fixing structure 1 mounted in a case of an electronic device 4 of the present invention. As shown in the drawing, to mount a fixing structure 1 in a case of an electronic device 4, the ledge part 111 connected with the carrier 11 must cross over the circuit board 5 with a small groove 53 which is erectly mounted on the top of the case of the electronic device 4, allowing the second connecting point 212 and the fourth connecting point 222 of the cable 2 of the first mounting hole 1111 and the second mounting hole 1112 to pass to the back of the backside 51 of the circuit board 5, for the ease of assembling and dissembling in latter processes. Thereby, it solves the problem of wasting material, resulted from drilling a hole 52 on the circuit board 5 when the cable 2 passes through the narrow space of the case of the electronic device 4. (As shown in FIG. 1)

Figure 6:
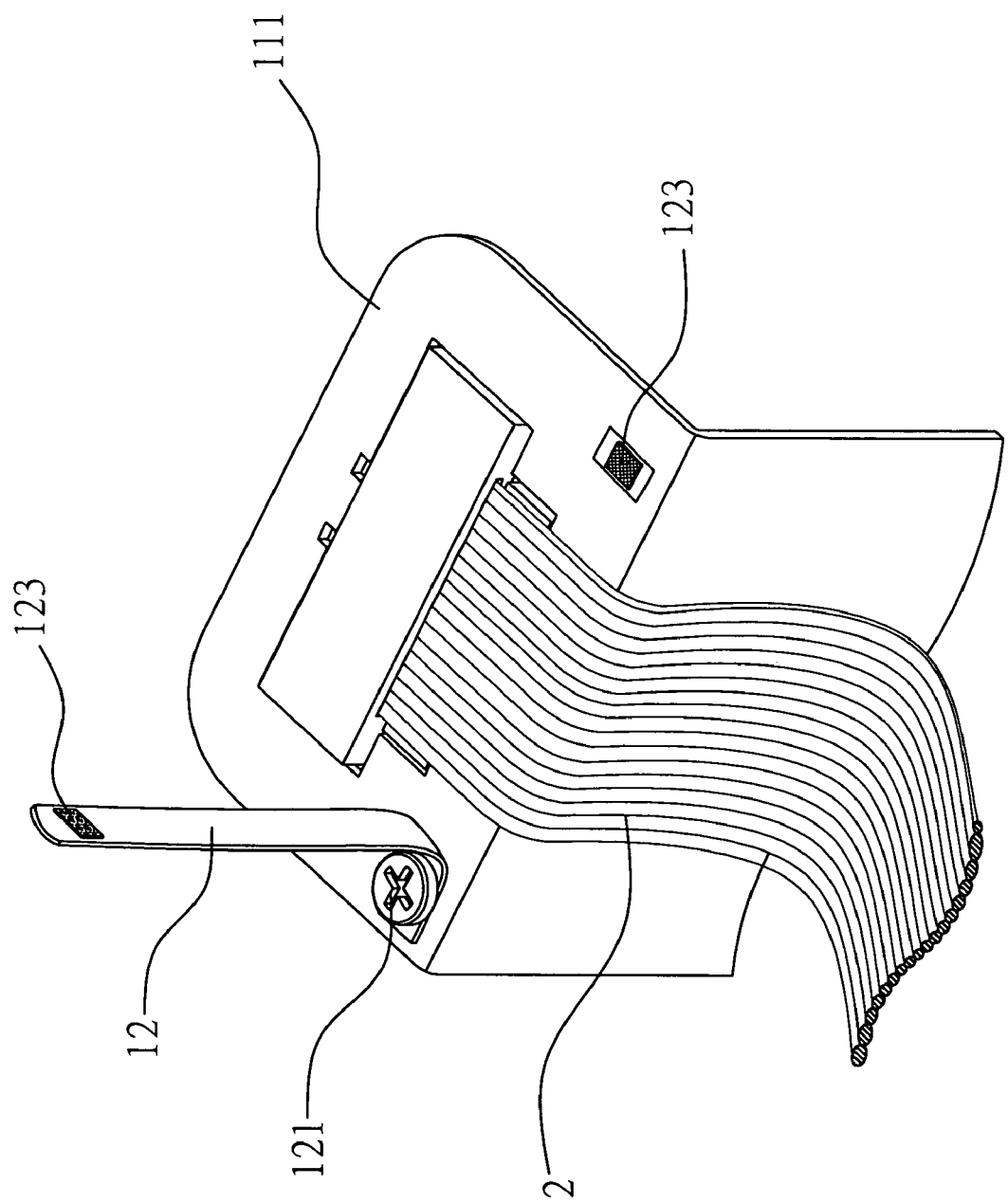
FIG. 6 is a schematic cross-sectional diagram showing a cable fixing structure of the second preferred embodiment of the present invention.

Referred to FIG. 6, is a schematic cross-sectional diagram of a cable fixing structure of the second preferred embodiment of the present invention. As shown in the drawing, one end of the press part 12 is screwed 121 on the ledge part 111, or alternatively another end can be fixed on the ledge part 111 through a magic adhesive tape 123, so as to physically couple the press part 12 with the ledge part 111, to easily assemble and disassemble the cable in a short time. Replacement with magic adhesive tape 123 on the two end of the press part 12 is also advantageous for reducing the production cost.

In summary, the cable fixing structure 1 proposed by the present invention allows a cable 2 crossing over a circuit board erectly mounted in a electronic device, from one end to another end of a case of an electronic device, such that it is not necessary to drill a relative big hole on the circuit board as shown in the prior art, therefore the cable fixing structure 1 of the present invention may be of high values in the industry.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A cable fixing structure mounted in a case of an electronic device allowing a cable crossing over a circuit board erectly mounted therein, then passing to another end of the electronic device, comprising:

a carrier, having a ledge part mounted thereon, wherein the ledge part has at least one first mounting hole and one first carrier protruded to the first mounting hole; and a press part, coupled with the ledge part thereon by at least one of a screw and a magic adhesive tape, for pressing and fixing the cable on the ledge part of the carrier.

2. The cable fixing structure of claim 1, wherein the ledge part further comprises a second mounting hole.

3. The cable fixing structure of claim 2, wherein the ledge part further comprises a second carrier protruding to the second mounting hole.

4. The cable fixing structure of claim 1, wherein the press part material can be made of a material selected from a group comprising an elastic material, plastic material or metal material.

* * * * *